US 9,608,609 B2

(12) United States Patent
Wasekura

(10) Patent No.: US 9,608,609 B2
(45) Date of Patent: Mar. 28, 2017

(54) SEMICONDUCTOR DEVICE

(71) Applicant: TOYOTA JIDOSHA KABUSHIKI KAISHA, Toyota-shi, Aichi-ken (JP)

(72) Inventor: Masaki Wasekura, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/029,687

(22) PCT Filed: Oct. 23, 2014

(86) PCT No.: PCT/IB2014/002200
§ 371 (c)(1),
(2) Date: Apr. 15, 2016

(87) PCT Pub. No.: WO2015/063564
PCT Pub. Date: May 7, 2015

(65) Prior Publication Data
US 2016/0269007 A1    Sep. 15, 2016

(30) Foreign Application Priority Data

Oct. 31, 2013   (JP) .................................. 2013-227677

(51) Int. Cl.
*H03B 1/00*   (2006.01)
*H03K 3/00*   (2006.01)
(Continued)

(52) U.S. Cl.
CPC ........... *H03K 5/08* (2013.01); *H03K 17/0828* (2013.01); *H03K 17/14* (2013.01); *H03K 17/18* (2013.01);
(Continued)

(58) Field of Classification Search
CPC .. H03K 17/16; H03K 17/567; H03K 17/0828; G01R 15/146
(Continued)

(56) References Cited

U.S. PATENT DOCUMENTS

2007/0159751 A1*   7/2007   Hussein .............. H01L 27/0255
                                                          361/100
2009/0057832 A1*   3/2009   Kouno ................ H01L 29/7397
                                                          257/577
(Continued)

FOREIGN PATENT DOCUMENTS

JP   2008-072848 A   3/2008
JP   2009-268054 A   11/2009
JP   2012-019550 A   1/2012

*Primary Examiner* — Lincoln Donovan
*Assistant Examiner* — Thomas Skibinski
(74) *Attorney, Agent, or Firm* — Oliff PLC

(57) ABSTRACT

A semiconductor device includes a transistor, a diode, a sense transistor, a sense diode, a resistor, and a clamp circuit. The diode is connected in inverse parallel to the transistor. The resistor is connected at one end of the resister to an emitter of the sense transistor and an anode of the sense diode, and is connected at the other end of the resister to an emitter of the transistor and an anode of the diode. The clamp circuit is configured to clamp a voltage that is generated in the resistor when a sense diode current flows. A ratio of a sense diode current to a current flowing to the diode is larger than a ratio of a sense current to a current flowing to the transistor.

16 Claims, 5 Drawing Sheets

(51) Int. Cl.
*H03K 5/08* (2006.01)
*H03K 17/082* (2006.01)
*H03K 17/14* (2006.01)
*H03K 17/18* (2006.01)
*H03K 17/567* (2006.01)
*H03K 17/74* (2006.01)

(52) U.S. Cl.
CPC ........... *H03K 17/567* (2013.01); *H03K 17/74* (2013.01); *H03K 2217/0027* (2013.01)

(58) Field of Classification Search
USPC ........ 327/108–112, 427, 434, 437, 378, 379, 327/51, 180, 309, 312, 321; 326/82, 83, 326/87; 361/100
See application file for complete search history.

(56) References Cited

U.S. PATENT DOCUMENTS

| | | | |
|---|---|---|---|
| 2016/0020763 A1* | 1/2016 | Osanai | H03K 17/042 327/108 |
| 2016/0231358 A1* | 8/2016 | Wasekura | H03K 17/08 |
| 2016/0233788 A1* | 8/2016 | Osanai | H02M 1/00 |
| 2016/0233856 A1* | 8/2016 | Wasekura | H03K 17/0828 |

* cited by examiner

SEMICONDUCTOR DEVICE

BACKGROUND OF THE INVENTION

1. Field of the Invention

The invention relates to a semiconductor device.

2. Description of Related Art

Conventionally, there is known an art of detecting a current flowing to a transistor, and a current flowing to a diode that is connected in inverse parallel to the transistor, through the use of a common sense resistor that is connected to a sense transistor and a sense diode (e.g., see Japanese Patent Application Publication No. 2012-19550 (JP-2012-19550 A)). A current proportional to the current flowing to the transistor flows to the sense transistor, and a current proportional to the current flowing to the diode flows to the sense diode.

However, the magnitude of the current desired to be detected in the transistor is different from the magnitude of the current desired to be detected in the diode. Therefore, there are cases where the ratio of the current flowing to the sense diode to the current flowing to the diode is desired to be increased. In the case where this ratio is set large, when an unintended overcurrent flows to the diode, the resistor that is connected to the sense transistor and the sense diode may deteriorate.

SUMMARY OF THE INVENTION

The invention provides a semiconductor device that can suppress a deterioration in a resistor that is connected to a sense transistor and a sense diode.

A semiconductor device according to an aspect of the invention includes a transistor, a diode, a sense transistor, a sense diode, a resistor, and a clamp circuit. The diode is connected in inverse parallel to the transistor. The sense transistor is configured to generate a sense current corresponding to a current flowing to the transistor. The sense diode is configured to generate a sense diode current corresponding to a current flowing to the diode, The resistor is connected at one end of the resister to an emitter of the sense transistor and an anode of the sense diode, and is connected at the other end of the resister to an emitter of the transistor and an anode of the diode. The clamp circuit is configured to clamp a voltage that is generated in the resistor when the sense diode current flows. A ratio of the sense diode current to the current flowing to the diode is larger than a ratio of the sense current to the current flowing to the transistor.

The aspect of the invention makes it possible to suppress a deterioration in the resistor that is connected to the sense transistor and the sense diode,

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The embodiments of the invention will be described hereinafter with reference to the drawings.

Figure 1:
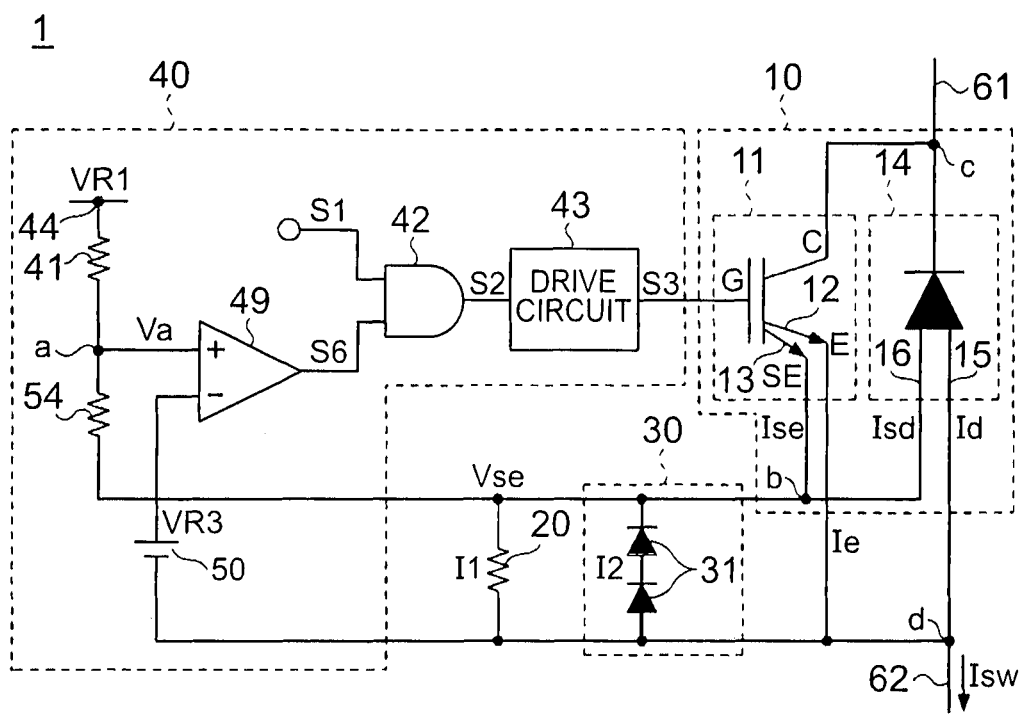
FIG. 1 is a block diagram of a semiconductor device according to the first embodiment of the invention.

FIG. 1 is a view showing a drive unit 1 corresponding to a semiconductor device according to the first embodiment of the invention. The drive unit 1 may be a semiconductor device having a configuration formed by an integrated circuit, or a semiconductor device having a configuration formed by discrete parts.

The drive unit 1 is a semiconductor circuit that is configured to drive inductive loads (e.g., an inductor, a motor and the like) that are connected to a first conductive portion 61 or a second conductive portion 62, by driving a main transistor 12 of a transistor portion 11 in an on/off manner. It is possible to mention, for example, a converter that steps up, steps down, or steps up/down the direct-current voltage, an inverter that carries out electric power conversion between a direct-current electric power and an alternating-current electric power, or the like, as a device in which the single drive unit 1 or a plurality of drive units 1 are employed.

For example, in the device in which the plurality of the drive units 1 are employed, there is provided a switching circuit in which switching elements 10 that are provided on a high side and a low side respectively are connected in series to an intermediate node to which inductive loads are connected. For example, a three-phase inverter as an example of the device in which the plurality of the drive units 1 are employed is equipped with three switching elements as mentioned herein in parallel therewith.

The conductive portion 61 is a current path that is conductively connected to to a high electric power supply potential portion such as a positive electrode of an electric power supply or the like, and may be indirectly connected to the high electric power supply potential portion via another switching element or another load. The conductive portion 62 is a current path that is conductively connected to to a low electric power supply potential portion (e.g., a ground potential portion) such as a negative electrode of an electric power supply or the like, and may be indirectly connected to the low electric power supply potential portion via another switching element or another load.

The drive unit 1 is equipped with the switching element 10. The switching element 10 is an insulated gate-type voltage control semiconductor element endowed with a current sensing function. The switching element 10 has the transistor portion 11 and a diode portion 14.

For example, in the case where the transistor portion 11 is an insulated gate bipolar transistor (an IGBT), the switching element 10 is a diode-integrated IGBT that has a common semiconductor substrate on which the transistor portion 11 and the diode portion 14 are provided. The diode-integrated IGBT is structured that an anode electrode of a diode and an emitter electrode of the IGBT constitute a common electrode, and that a cathode electrode of the diode and a collector electrode of the IGBT constitute a common electrode. The diode-integrated IGBT is also referred to as a reverse conducting IGBT (an RC IGBT).

A power transistor element such as an IGBT, a metal oxide semiconductor field effect transistor (a MOSFET) or the like can be mentioned as a concrete example of the transistor portion 11. An IGBT as an example of the transistor portion 11 is shown in FIG. 1. For the convenience of explanation, the following description will be given on the assumption that the transistor portion 11 is an IGBT. In the case where the transistor portion 11 is a MOSFET, the following description may be read after replacing "collector" and "emitter" with "drain" and "source" respectively.

A gate terminal G of the transistor portion 11 is, for example, a control terminal that is connected to a drive circuit 43 of a control circuit 40 via a gate resistor that is connected in series to the gate terminal G. A collector terminal C of the transistor portion 11 is, for example, a first main terminal that is connected to a connection point c and that is connected to the conductive portion 61 via the connection point c. An emitter terminal E of the transistor portion 11 is, for example, a second main terminal that is connected to a connection point d and that is connected to the conductive portion 62 via the connection point d. A sense emitter terminal SE of the transistor portion 11 is, for example, a sense terminal that is connected to a connection point b and that is connected to one end of a sense resistor 20 via the connection point b. The sense emitter terminal SE is connected to the conductive portion 62 via the connection point d to which the other end of the sense resistor 20 is connected.

The transistor portion 11 is configured to include a main transistor 12 and a sense transistor 13. The main transistor 12 and the sense transistor 13 are switching elements such as IGBT's or the like. The sense transistor 13 is connected in parallel to the main transistor 12. Each of the main transistor 12 and the sense transistor 13 may be constituted of a plurality of cell transistors.

Gate electrodes g of the main transistor 12 and the sense transistor 13 are control electrodes that are connected in common to the gate terminal G of the transistor portion 11. Collector electrodes c of the main transistor 12 and the sense transistor 13 are first main electrodes that are connected in common to the collector terminal C of the transistor portion 11. An emitter electrode e of the main transistor 12 is a second main electrode that is connected to the emitter terminal E of the transistor portion 11. A sense emitter electrode se of the sense transistor 13 is a sense electrode that is connected to the sense emitter terminal SE of the transistor portion 11.

The sense transistor 13 is an example of a sense transistor that generates a current corresponding to a current flowing to the main transistor 12, and is a sense element to which the current that increases as the current flowing to the main transistor 12 increases flows. The sense transistor 13 outputs, for example, a sense current Ise that is proportional to a main current Ie flowing to the main transistor 12.

For example, a collector current flowing into the transistor portion 11 from the collector terminal C is divided into the main current Ie flowing through the main transistor 12 and the sense current Ise flowing through the sense transistor 13 at a sense ratio n. The sense current Ise is a current that flows in accordance with the main current Ie at the sense ratio n, and is a current whose value is made smaller than the main current Ie at the sense ratio n.

The sense ratio n indicates that the ratio between the magnitude of the sense current Ise and the magnitude of the main current Ie is 1:n (n>1). The sense ratio n is determined in accordance with, for example, the ratio between the area of the emitter electrode e of the main transistor 12 and the area of the sense emitter electrode se of the sense transistor 13.

The main current Ie flows through the collector electrode c and the emitter electrode e in the main transistor 12, and is output from the emitter terminal E. The main current Ie output from the emitter terminal E flows through the conductive portion 62 via the connection point d. The sense current Ise flows through the collector electrode c and the sense emitter electrode se in the sense transistor 13, and is output from the sense emitter terminal SE. The sense current Ise output from the sense emitter terminal SE flows through the conductive portion 62 via the sense resistor 20 and the connection point d.

On the other hand, the diode portion 14 is configured to include a main diode 15 and a sense diode 16.

The main diode 15 is an example of a diode that is connected in inverse parallel to the main transistor 12, and is a reverse conducting element having an anode that is connected to the emitter terminal E, and a cathode that is connected to the collector terminal C. The anode electrode of the main diode 15 is a P-type electrode that is connected to the connection point d, to which the emitter terminal E is connected, and that is connected to the conductive portion 62 via the connection point d. The cathode electrode of the main diode 15 is an N-type electrode that is connected to the connection point c, to which the collector terminal C is connected, and that is connected to the conductive portion 61 via the connection point c.

The sense diode 16 is an example of a sense diode that generates a current corresponding to the current flowing to the main diode 15, and is a sense element to which the current that increases as the current flowing to the main diode 15 increases flows. The sense diode 16 outputs, for example, a sense diode current Isd that is proportional to a diode current Id flowing to the main diode 15.

The sense diode current Isd is a current that flows in accordance with the diode current Id at a sense ratio m, and is a current whose value is made smaller than the diode current Id at the sense ratio m. The sense ratio m indicates that the ratio between the magnitude of the sense diode current Isd and the magnitude of the diode current Id is 1:m (m>1).

The anode electrode of the sense diode 16 is a P-type electrode that is connected to the connection point b, to which the sense emitter terminal SE is connected, and that is connected to the conductive portion 62 via the sense resistor 20 and the connection point d. The cathode electrode of the sense diode 16 is an N-type electrode that is connected to the connection point c, to which the collector terminal C is connected, and that is connected to the conductive portion 61 via the connection point c.

The drive unit 1 has the sense resistor 20 that is provided between the sense emitter terminal SE and the emitter terminal E. The sense resistor 20 is an example of a resistor portion that is connected at one end thereof to the connection point b, which is connected in common to the sense emitter electrode se of the sense transistor 13 and the anode electrode of the sense diode 16, and that is connected at the other end thereof to the connection point d, which is connected in common to the emitter electrode e of the main transistor 12 and the anode electrode of the main diode 15.

The drive unit 1 is equipped with the control circuit 40 having a detection unit configured to detect the magnitude of the main current Ie based on the magnitude of the sense current Ise, and to detect the magnitude of the diode current Id based on the magnitude of the sense diode current Isd.

The control circuit 40 has, for example, a detection unit configured to detect the magnitude of the sense current Ise and to detect the magnitude of the main current Ie by detecting the magnitude of a sense voltage Vse that is generated when the sense current Ise flows. The sense voltage Vse that is generated when the sense current Ise flows is a positive voltage whose magnitude changes in accordance with the magnitude of the sense current Ise. For example, due to the flow of the sense current Ise to the sense resistor 20, the sense voltage Vse is generated at both ends of the sense resistor 20.

By the same token, the control circuit 40 has, for example, a detection unit configured to detect the magnitude of the sense diode current Isd and to detect the magnitude of the diode current Id by detecting the magnitude of the sense voltage Vse that is generated when the sense diode current Isd flows. The sense voltage Vse that is generated when the sense diode current Isd flows is a negative voltage whose magnitude changes in accordance with the magnitude of the sense diode current Isd. For example, due to the flow of the sense diode current Isd to the sense resistor 20, the sense voltage Vse is generated at both ends of the sense resistor 20.

The sense voltage Vse is, for example, the voltage between both ends of the sense resistor 20, and is equal to a potential difference between the connection point b and the connection point d. The sense voltage Vse has a negative voltage value when the sense diode current Isd flows to the sense resistor 20 in the same direction as the forward direction of the sense diode 16. Besides, the sense voltage Vse has a positive voltage value when the sense current Ise flows to the sense resistor 20 in the direction reverse to the forward direction of the sense diode 16. Besides, the sense voltage Vse is zero when the sense diode current Isd or the sense current Ise does not flow to the sense resistor 20.

The sense ratio m of the diode portion 14 and the sense ratio n of the transistor portion 11 are set such that a ratio p of the sense diode current Isd to the diode current Id becomes larger than a ratio q of the sense current Ise to the main current Ie, In the case where the ratio between the magnitude of the sense diode current Isd and the magnitude of the diode current Id is set to 1:m, the ratio p is equal to 1/m. In the case where the ratio between the magnitude of the sense current Ise and the magnitude of the main current Ie is set to 1:n, the ratio q is equal to 1/n. Each of the values m and n is larger than 1.

For example, in the case where the values m and n are 1000 and 2000 respectively, the ratio p (=1/1000) is set larger than the ratio q (=1/2000).

The ratio p is set larger than the ratio q, so even if the diode current Id and the main current Ie are equal in magnitude to each other (even if the absolute values of the current values are equal to each other), the magnitude of the sense diode current Isd can be made larger than the magnitude of the sense current Ise. Accordingly, even when the magnitude of the diode current Id is relatively small, the sense diode current Isd and the sense voltage Vse whose absolute values are relatively large can be generated. Therefore, the detection sensitivity of the diode current Id can be made higher than the detection sensitivity of the main current Ie.

For example, when the ratio p is larger than the ratio q, the main current Ie that is relatively large like an overcurrent can be detected based on the sense voltage Vse, whereas it can be accurately detected, based on the sense voltage Vse, that the diode current Id in the vicinity of zero ampere flows to the main diode 15. For example, the control circuit 40 can detect, based on the sense voltage Vse, that the main current Ie equal to or larger than a predetermined value flows to the main transistor 12, and can detect, based on the sense voltage Vse, that the diode current Id slightly larger than zero flows to the main diode 15.

However, when the ratio p is larger than the ratio q, even the relatively small diode current Id makes it possible to generate the sense diode current Isd whose absolute value is relatively large. Therefore, when the excessively large diode current Id unexpectedly flows to the main diode 15, the excessively large sense diode current Isd flows to the sense resistor 20 and may cause a deterioration in the sense resistor 20.

Besides, the sense resistor 20 is set to a small value so as to correspond to the magnitude of the excessively large main current Ie that is desired to be detected.

Therefore, even when the somewhat large sense diode current Isd flows to the sense resistor 20, the sense resistor 20 may deteriorate.

Thus, the drive unit 1 has a clamp circuit 30 that is connected in parallel to the sense resistor 20. The clamp circuit 30 is connected at one end thereof to the connection point b and one end of the sense resistor 20, and is connected at the other end thereof to the connection point d and the other end of the sense resistor 20. The clamp circuit 30 is a circuit that clamps the negative sense voltage Vse generated at both the ends of the sense resistor 20 on a predetermined clamp voltage value when the sense diode current Isd flows to the sense resistor 20.

Accordingly, the clamp circuit 30 can suppress the excessively large negative sense voltage Vse, and hence can restrain the sense resistor 20 and an element (e.g., a comparator 49) that is connected to the sense resistor 20 from deteriorating due to a negative overvoltage.

Besides, the clamp circuit 30 is connected in parallel to the sense resistor 20 such that a current flows to the clamp circuit 30. Therefore, the sense diode current Isd can be divided into a current I1 flowing to the sense resistor 20 and a current I2 flowing to the clamp circuit 30. Then, the clamp circuit 30 has a sufficient current capacity, so the current supplied to the sense resistor 20 can be distributed to the clamp circuit 30. Therefore, the sense resistor 20 can be restrained from deteriorating due to an overcurrent.

The clamp voltage value of the clamp circuit 30 is set to a value smaller than the product (a voltage value) of a peak current value of the sense diode current Isd and a resistance value of the sense resistor 20 at the time when there is no clamp circuit 30.

The clamp circuit 30 has, for example, a diode 31 that clamps the negative sense voltage Vse on a predetermined clamp voltage value. The diode 31 is an example of a PN junction whose forward direction is identical to a forward direction of the sense diode 16, so that the sense diode current Isd flows through the diode 31. Besides, the diode 31 is arranged in such a manner as to prevent the sense current Ise from flowing to the clamp circuit 30. Therefore, the sense current Ise flows to the sense resistor 20 instead of flowing to the clamp circuit 30.

The diode 31 is arranged and connected in parallel to the sense resistor 20, and has a cathode electrode that is connected to the connection point b and one end of the sense resistor 20, and an anode electrode that is connected to the connection point d and the other end of the sense resistor 20. Either a single diode 31 or a plurality of diodes 31 may be provided. In FIG. 1, two diodes 31 are connected in series to each other.

The drive unit 1 is equipped with the control circuit 40. The control circuit 40 is an example of a control unit that controls the driving of the main transistor 12 and the sense transistor 13 based on a detection result of the sense voltage Vse.

The control circuit 40 turns off the main transistor 12 and the sense transistor 13 when the negative sense voltage Vse that is generated due to the flow of the sense diode current Isd through the sense resistor 20 and the clamp circuit 30 is detected. Thus, the main transistor 12 and the sense transistor 13 can be prevented from being turned on when the diode current Id flows. Besides, when the diode current Id flows, the main transistor 12 and the sense transistor 13 are turned on, so the loss in the diode portion 14 can be prevented from increasing.

For example, the control circuit 40 turns off the main transistor 12 and the sense transistor 13 when it is detected that the sense voltage Vse is equal to or lower than a predetermined threshold (e.g., zero or a predetermined negative voltage value).

The control circuit 40 has a resistor 41, a resistor 54, the comparator 49, an AND circuit 42, and the drive circuit 43.

Each of the resistor 41 and the resistor 54 is an example of a conversion unit that equivalently converts the sense voltage Vse into a detected voltage Va. The resistor 54 is connected at one end thereof to the connection point b and one end of the sense resistor 20, and is connected at the other end thereof to one end of the resistor 41.

The resistor 41 is connected at one end thereof to the other end of the resistor 54, and is connected at the other end thereof to a reference voltage portion 44 that outputs a certain reference voltage VR1. A connection point a between one end of the resistor 41 and the other end of the resistor 54 is connected to a non-inversion input portion of the comparator 49. The detected voltage Va that is output from the connection point a is input to the non-inversion input portion of the comparator 49.

The resistor 41 and the resistor 54 can equivalently convert the negative sense voltage Vse that is generated when the sense diode current Isd flows to the sense resistor 20, into the positive detected voltage Va. Thus, no negative voltage is input to the non-inversion input portion of the comparator 49, so the configuration of the non-inversion input portion of the comparator 49 can be simplified.

The comparator 49 is an example of a determination circuit that determines whether the sense current Ise flows to the sense resistor 20 or the sense diode current Isd flows to the sense resistor 20. The comparator 49 can detect that the sense diode current Isd stops flowing or that the sense current Ise starts flowing, and can detect that the sense current Ise stops flowing or that the sense diode current Isd starts flowing.

The comparator 49 inverts the voltage level of an output signal S6 at a timing when it is detected that the sense voltage Vse changes across a predetermined threshold Vth. For example, the comparator 49 has a non-inversion input portion that is connected to the connection point a, and an inversion input portion that is connected to the reference voltage portion 50. The reference voltage portion 50 outputs a certain reference voltage VR3 to the inversion input portion of the comparator 49. That is, in this case, the comparator 49 inverts the voltage level of the output signal S6 at a timing when it is detected that the detected voltage Va corresponding to the sense voltage Vse changes across the reference voltage VR3.

When the diode current Id flows, the sense diode current Isd flows as well, so the sense voltage Vse is a negative voltage. When it is detected that the sense voltage Vse changes from a negative value to a value equal to or larger than zero (i.e., zero or a positive value), the comparator 49 changes over the output signal S6 from low level to high level. The comparator 49 detects that the sense voltage Vse changes from a negative value to a value equal to or larger than zero (i.e., zero or a positive value), for example, by monitoring that the detected voltage Va exceeds the reference voltage VR3.

On the other hand, when the main current Ie flows, the sense current Ise flows as well, so the sense voltage Vse is a positive voltage. When it is detected that the sense voltage Vse changes from a positive value to a value equal to or smaller than zero (i.e., zero or a negative value), the comparator 49 changes over the output signal S6 from high level to low level. The comparator 49 detects that the sense voltage Vse changes from a positive value to a value equal to or smaller than zero (i.e., zero or a negative value), for example, by monitoring that the detected voltage Va becomes lower than the reference voltage VR3.

The output signal S6 of the comparator 49 is input to the AND circuit 42.

The AND circuit 42 is an example of a determination unit that determines, based on the voltage level of a command signal S1 and the voltage level of the output signal S6, whether the main transistor 12 and the sense transistor 13 should be turned on or off. The AND circuit 42 calculates a logical product of the command signal S1 and the output signal S6, and outputs a pre-drive signal S2. The command signal S1 is a signal for commanding the main transistor 12 and the sense transistor 13 to be turned on/off, and is a signal (e.g., a pulse width modulation signal) that is supplied from an external device such as a microcomputer or the like.

In the case where at least one of the command signal S1 and the output signal S6 is a low-level signal that commands the main transistor 12 and the sense transistor 13 to be turned off, the AND circuit 42 outputs the low-level pre-drive signal S2. The low-level pre-drive signal S2 is a signal for turning off the main transistor 12 and the sense transistor 13. That is, even upon receiving the high-level command signal S1 for commanding the main transistor 12 and the sense transistor 13 to be turned on, the AND circuit 42 outputs the low-level pre-drive signal S2 when the output signal S6 is at low level.

On the other hand, in the case where both the command signal S1 and the output signal S6 are high-level signals for commanding the main transistor 12 and the sense transistor 13 to be turned on, the AND circuit 42 outputs the high-level pre-drive signal S2. The high-level pre-drive signal S2 is a signal for turning on the main transistor 12 and the sense transistor 13.

The drive circuit 43 outputs a gate drive signal S3 that is identical in phase to the pre-drive signal S2 that is output from the AND circuit 42. The drive circuit 43 shifts the voltage level of the pre-drive signal S2 to a higher level, and outputs the gate drive signal S3 that is higher in voltage level than the pre-drive signal S2, such that the main transistor 12 and the sense transistor 13 can be driven.

Thus, when it is detected that the diode current Id flows to the main diode 15, the control circuit 40 can turn off the main transistor 12 and the sense transistor 13. On the other hand, when it is detected that the normal main current Ie flows to the main transistor 12, the main transistor 12 and the sense transistor 13 can be turned on.

Figure 2:
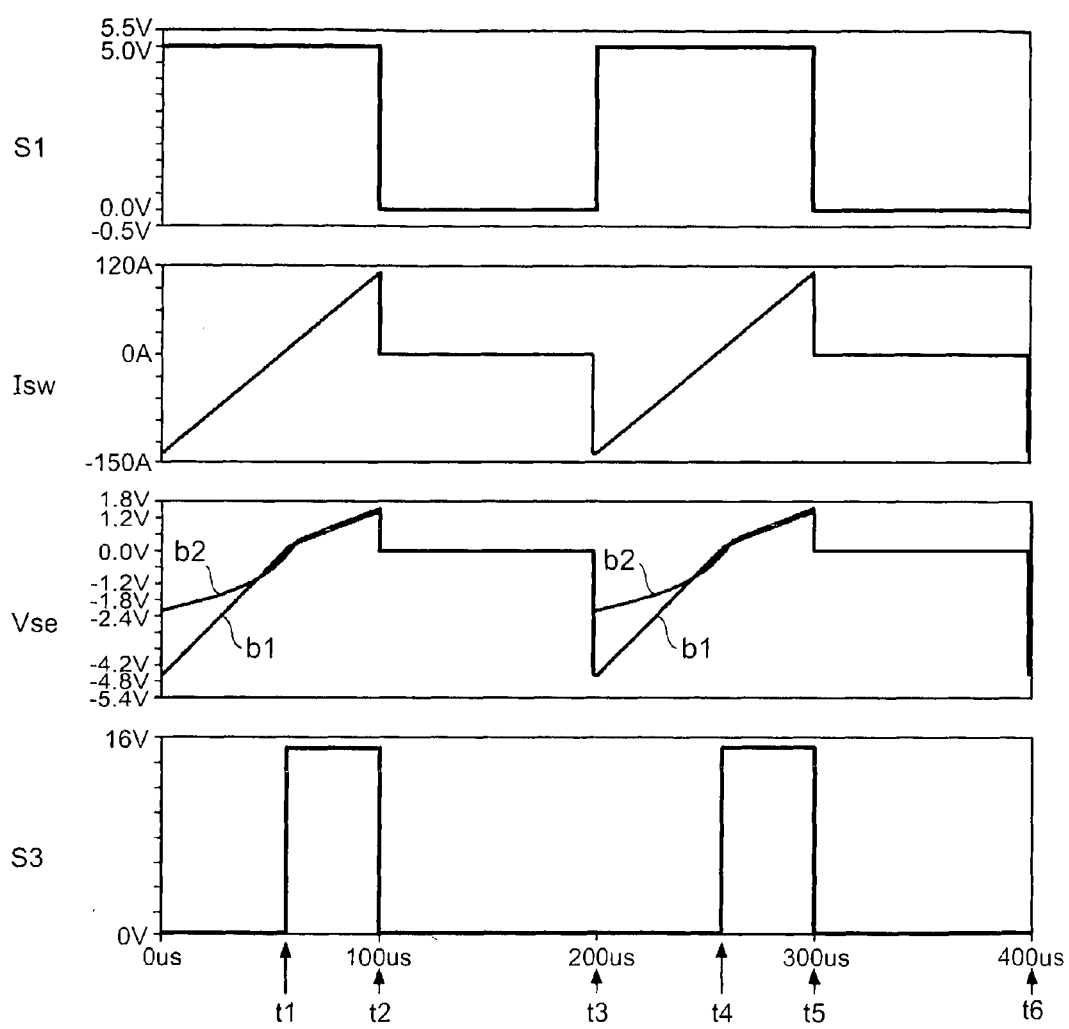
FIG. 2 shows timing charts showing an example of operation waveforms of the semiconductor device.

FIG. 2 shows timing charts showing an example of operation waveforms of the drive unit 1. The command signal S1 is a signal for commanding the main transistor 12 and the sense transistor 13 to be turned on/off. A current Isw is a current flowing through the conductive portion 62, and is approximately equal to the sum of the main current Ie and the diode current Id. Incidentally, the sense current Ise is sufficiently smaller than the main current Ie, and the sense diode current Isd is sufficiently smaller than the diode current Id. Therefore, the magnitudes of the sense current Ise and the sense diode current Isd are negligible with respect to the current Isw.

The period in which the current Isw has negative values indicates that the current Isw flows in the same direction as the forward direction of the main diode 15 and the sense diode 16. The forward direction of the main diode 15 and the sense diode 16 is a direction from the anode electrode toward the cathode electrode. On the other hand, the period in which the current Isw has positive values indicates that the current Isw flows in the direction reverse to the forward direction of the main diode 15 and the sense diode 16. The direction reverse to the forward direction of the main diode 15 and the sense diode 16 is a direction from the collector terminal C toward the emitter terminal E or the sense emitter terminal SE.

When the diode current Id flows, the sense diode current Isd flows, so the sense voltage Vse is a low-level negative voltage. When the sense voltage Vse is a low-level negative voltage, the output signal S6 is at low level. In consequence, when the command signal S1 is at high level and the output signal S6 is at low level, the gate drive signal S3 is at low level, so both the main transistor 12 and the sense transistor 13 are turned off. Since both the main transistor 12 and the sense transistor 13 are turned off, the main current Ie and the sense current Ise are kept from flowing. Accordingly, when the main current Ie and the sense current Ise are kept from flowing, the current Isw is approximately equal to the sum of the diode current Id, the current I1 flowing to the sense resistor 20, and the current I2 flowing to the clamp circuit 30.

As the diode current Id decreases, the sense diode current Isd decreases as well. The sense diode current Isd is approximately equal to the sum of the current I1 and the current I2. When the diode current Id decreases to zero ampere, the current Isw also becomes approximately equal to zero ampere. In the vicinity of zero ampere where the current Isw changes over from a negative value to a positive value, the output signal S6 changes over from low level to high level (see timings t1 and t4). Thus, the gate drive signal S3 is at high level.

In consequence, when the command signal S1 is at high level and the output signal S6 is at high level, the gate drive signal S3 is at high level, so both the main transistor 12 and the sense transistor 13 are turned on. Since both the main transistor 12 and the sense transistor 13 are turned on, the main current Ie and the sense current Ise gradually increase, so the current Isw gradually increases as well (see a period t1-t2 and a period t4-t5).

In FIG. 2, a waveform bi indicates a case where there is no clamp circuit 30, and a waveform b2 indicates a case where the clamp circuit 30 exists. In either case, the ratio p of the sense diode current Isd to the diode current Id is set lager than the ratio q of the sense current Ise to the main current Ie.

In the case of the waveform b1 when there is no clamp circuit 30, the ratio p is larger than the ratio q, so the absolute value of a negative peak of the sense voltage Vse is larger than the absolute value of a positive peak of the sense voltage Vse. In the case of FIG. 2, a negative peak voltage of about −4.8 V and a positive peak voltage of about 1.8 V are generated.

In contrast, in the case of the waveform b2 when the clamp circuit 30 exists, while the detection sensitivity of the current Isw in the vicinity of zero ampere is maintained, the negative peak voltage of the sense voltage Vse is held equal to about −2.3 V. Accordingly, the sense resistor 20 itself or the element that is connected to the sense resistor 20 can be restrained from deteriorating due to a negative overvoltage.

When the command signal S1 changes over from high level to low level, the gate drive signal S3 changes over from high level to low level (see timings t2 and t5), so both the main transistor 12 and the sense transistor 13 are turned off. Since both the main transistor 12 and the sense transistor 13 are turned off, the main current Ie and the sense current Ise are kept from flowing (see a period t2-t3 and a period t5-t6).

As the main current Ie decreases, the sense current Ise decreases as well.

The sense current Ise is approximately equal to the current I1. Due to the diode 31, the sense current Ise does not flow to the clamp circuit 30. When the main current Ie decreases to zero ampere, the current Isw becomes approximately equal to zero ampere as well. In the vicinity of zero ampere where the current Isw changes over from a positive value to a negative value, the output signal S6 changes over from high level to low level (see the timings t2 and t5). Thus, the gate drive signal S3 is at low level.

Figure 3:
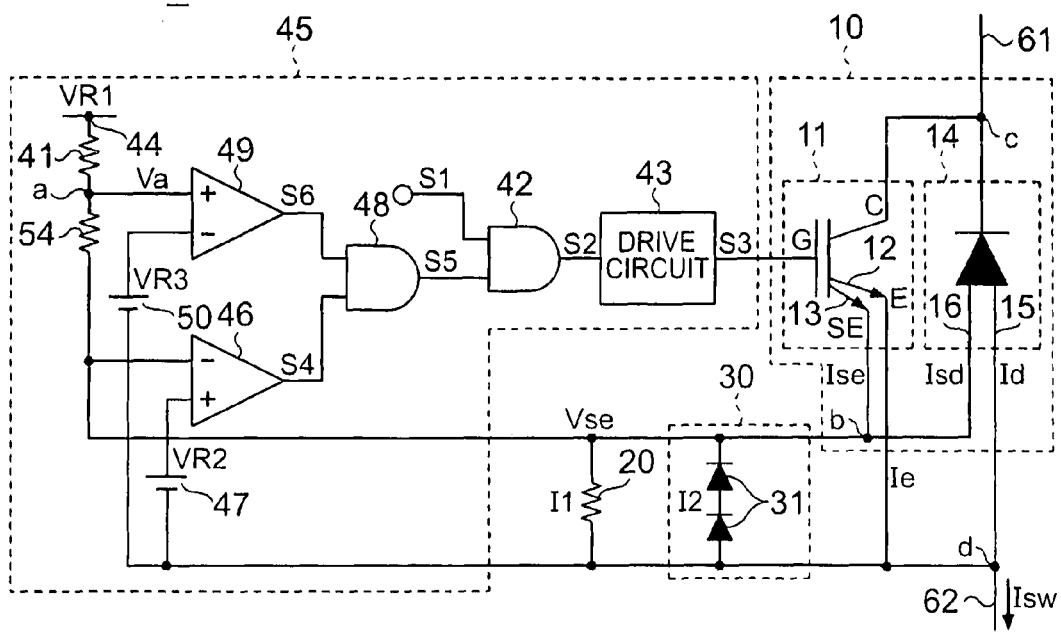
FIG. 3 is a block diagram of a semiconductor device according to the second embodiment of the invention.

FIG. 3 is a view showing a drive unit 2 corresponding to a semiconductor device according to the second embodiment of the invention. The same configuration and effect as those of the aforementioned drive unit 1 will not be described. The drive unit 2 is equipped with a control circuit 45 having an overcurrent detection circuit that turns off the main transistor 12 and the sense transistor 13 based on the positive sense voltage Vse that is generated due to the flow of the current I1 to the sense resistor 20.

A comparator 46 is an example of the overcurrent detection circuit. The comparator 46 has an inversion input portion that is connected to the connection point b and one end of the sense resistor 20, and a non-inversion input portion that is connected to a reference voltage portion 47 that outputs a certain reference voltage VR2. The reference voltage VR2 is a threshold voltage for determining whether or not the main current Ie is an overcurrent.

When the diode current Id flows, the sense voltage Vse is lower than the reference voltage VR2, so the comparator 46 outputs a high-level output signal S4. Besides, when the normal main current Ie that is smaller than an overcurrent flows to the main transistor 12, the sense voltage Vse is lower than the reference voltage VR2, so the comparator 46 outputs the high-level output signal S4. Besides, when the excessively large main current Ie that is equal to or larger than a predetermined value flows to the main transistor 12, the sense voltage Vse becomes higher than the reference voltage VR2, so the comparator 46 outputs the low-level output signal S4.

The control circuit 45 has an AND circuit 48 to which the output signal S6 of the comparator 49 and the output signal S4 of the comparator 46 are input. The AND circuit 48 is an example of a determination unit that determines, based on the voltage level of the output signal S4 and the voltage level of the output signal S6, whether the main transistor 12 and the sense transistor 13 should be turned on or off. The AND circuit 48 calculates a logical product of the output signal S4 and the output signal S6, and outputs an output signal S5.

The AND circuit 42 is an example of a determination unit that determines, based on the voltage level of the command signal S1 and the voltage level of the output signal S5, whether the main transistor 12 and the sense transistor 13 should be turned on or off. The AND circuit 42 calculates a logical product of the command signal S1 and the output signal S5, and outputs the pre-drive signal S2.

Thus, when it is detected at least either that the diode current Id flows to the main diode 15 or that the excessively large main current Ie flows to the main transistor 12, the control circuit 45 can turn off the main transistor 12 and the sense transistor 13. On the other hand, when it is detected that the normal main current Ie flows to the main transistor 12, the main transistor 12 and the sense transistor 13 can be turned on.

Figure 4:
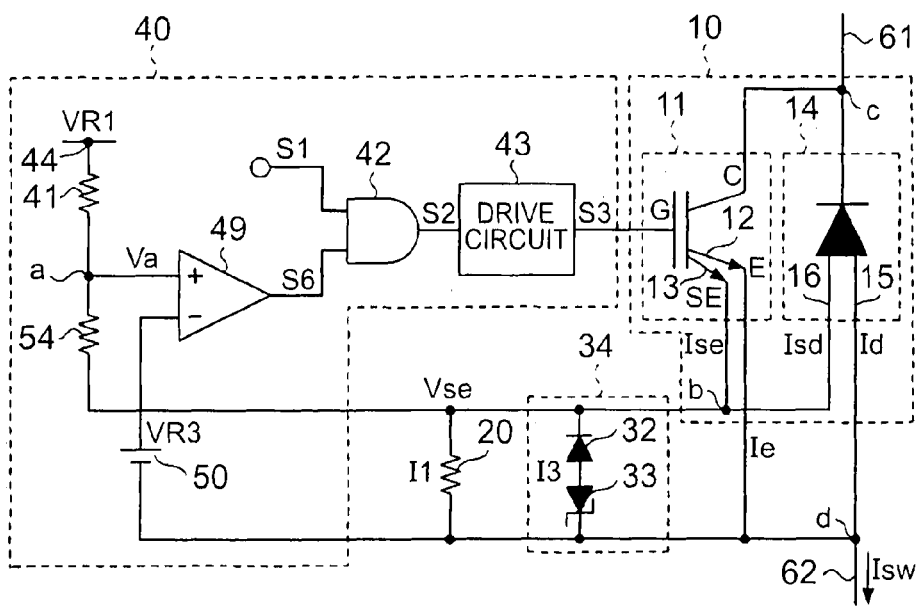
FIG. 4 is a block diagram of a semiconductor device according to the third embodiment of the invention.

FIG. 4 is a view showing a drive unit 3 corresponding to a semiconductor device according to the third embodiment of the invention. The same configuration and effect as those of the aforementioned drive unit 1 or 2 will not be described. The drive unit 3 is equipped with a clamp circuit 34 that clamps the negative sense voltage Vse on a predetermined clamp voltage value.

The clamp circuit 34 has a diode 32 and a Zener diode 33 that clamp the negative sense voltage Vse on the predetermined clamp voltage value. By adjusting the Zener voltage of the Zener diode 33, the clamp voltage value on which the negative sense voltage Vse is clamped can be easily set to any value.

The diode 32 is an example of a PN junction that is identical in forward direction to the sense diode 16, so that the sense diode current Isd flows through the diode 32. Besides, the diode 32 is arranged in such a manner as to prevent the sense current Ise from flowing to the clamp circuit 34, so the sense current Ise flows to the sense resistor 20 instead of flowing to the clamp circuit 34.

The diode 32 is arranged and connected in parallel to the sense resistor 20, and has a cathode electrode that is connected to the connection point b and one end of the sense resistor 20, and an anode electrode that is connected to the connection point d and the other end of the sense resistor 20 via the Zener diode 33. Either a single diode 32 or a plurality of diodes 32 may be provided. The plurality of the diodes 32 may be connected in series to one another.

The Zener diode 33 is a diode whose forward direction is reverse to the forward direction of the sense diode 16, such that the sense diode current Isd flows through the Zener diode 33 only when the sense voltage Vse is equal to or higher than the Zener voltage of the Zener diode 33.

The sense diode current Isd flows to the clamp circuit 34 and the sense resistor 20 when the sense voltage Vse is equal to or higher than the Zener voltage of the Zener diode 33. The sense diode current Isd flows to the sense resistor 20 instead of flowing to the clamp circuit 34 when the sense voltage Vse is lower than the Zener voltage of the Zener diode 33.

The Zener diode 33 is connected in series to the diode 32, and has a cathode electrode that is connected to the connection point d, and an anode electrode that is connected to the anode electrode of the diode 32. Incidentally, the position where the Zener diode 33 is arranged and the position where the diode 32 is arranged may be replaced with each other.

Figure 5:
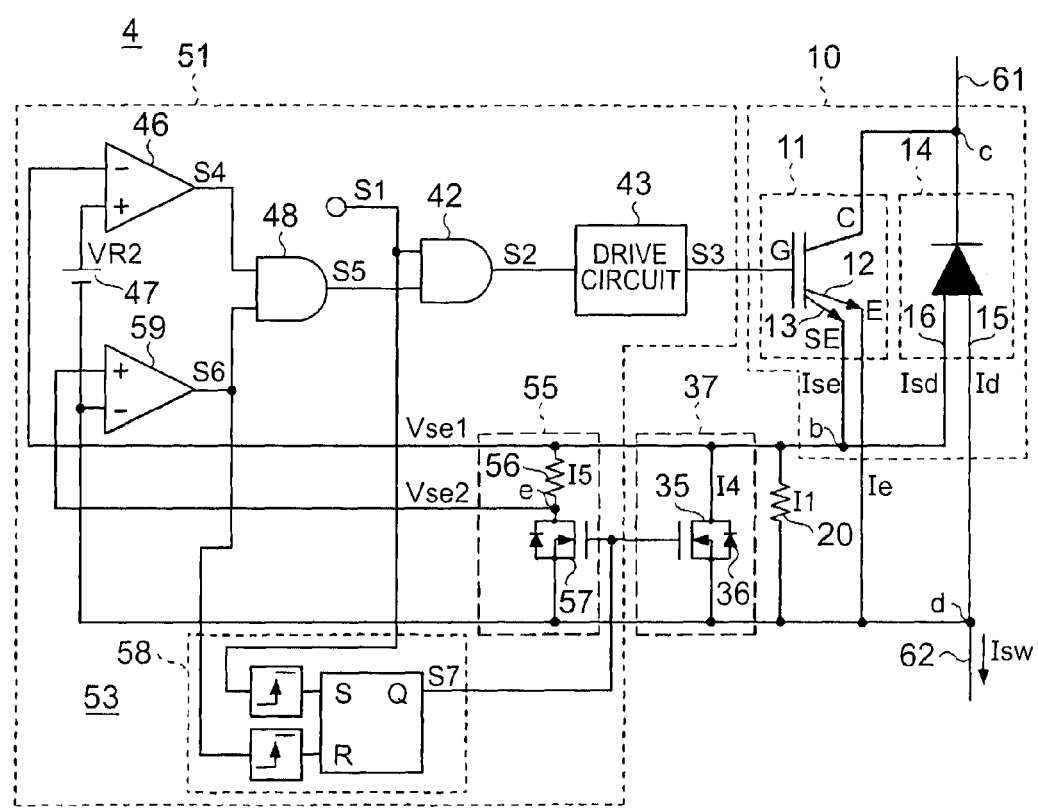
FIG. 5 is a block diagram of a semiconductor device according to the fourth embodiment of the invention.

FIG. 5 is a view showing a drive unit 4 corresponding to a semiconductor device according to the fourth embodiment of the invention. The same configuration and effect as those of the aforementioned drive unit 1, 2 or 3 will not be described. The drive unit 4 is equipped with a clamp circuit 37 that clamps the negative sense voltage Vse on a predetermined clamp voltage value.

The clamp circuit 37 is equipped with a transistor 35 having a parasitic diode 36 that is identical in forward direction to the sense diode 16 such that the sense diode current Isd flows through the clamp circuit 37. The transistor 35 is an example of a switching element that has a PN junction in parallel therewith.

Due to the turning on of the transistor 35, an on-resistor of the transistor 35 is synthesized with the sense resistor 20, so the clamp voltage value on which the negative sense voltage Vse is clamped can be raised in such a manner as to approach zero. That is, the occurrence of an excessively large negative voltage can be suppressed by holding the absolute value of the negative peak voltage of the sense voltage Vse small. The resistance value of the on-resistor of the transistor 35 is lower than the resistance value of the sense resistor 20.

FIG. 5 exemplifies a case where the transistor 35 is an N channel-type MOSFET. In this case, the transistor 35 has a gate electrode to which an output signal S7 is input, a drain electrode that is connected to the connection point b and one end of the sense resistor 20, and a source electrode that is connected to the connection point d and the other end of the sense resistor 20. The transistor 35 may be another switching element such as a bipolar transistor or the like that has a PN junction in parallel therewith.

The drive unit 4 has a clamp control circuit 53 that outputs the high-level output signal S7 for turning on the transistor 35 when the sense diode current Isd flows.

The high-level output signal S7 is input to the gate electrode of the transistor 35, so the transistor 35 is turned on when the sense diode current Isd flows.

The clamp control circuit 53 has a monitor circuit 55 that monitors a current I4 that flows between the source and drain of the transistor 35. The clamp control circuit 53 outputs the output signal S7 for controlling the driving of the transistor 35, based on a result of detection of the current I4 by the monitor circuit 55.

The monitor circuit 55 is, for example, a series circuit that has a monitor resistor 56 and a transistor 57 that is connected in series to the monitor resistor 56, and is a circuit that is connected in parallel to the transistor 35 of the clamp circuit 37.

A current I5 corresponding to the current I4 flowing to the transistor 35 flows through the monitor resistor 56. The monitor resistor 56 is connected at one end thereof to one end of the sense resistor 20 and the connection point b, and is connected at the other end thereof to the other end of the sense resistor 20 and the connection point d via the transistor 57.

The transistor 57 is an example of a control element that controls the current I4 flowing to the monitor resistor 56 in synchronization with the turning on/off of the transistor 35. The transistor 57 is turned on when the transistor 35 is on, and is turned off when the transistor 35 is off. The current I5 flows as soon as the transistor 57 is turned on. The current I5 stops flowing as soon as the transistor 57 is turned off. A sense voltage Vse2 is generated due to the flow of the current I5.

FIG. 5 exemplifies a case where the transistor 57 is an N channel-type MOSFET. In this case, the transistor 57 has a gate electrode to which the output signal S7 is input, a drain electrode that is connected to the other end of the monitor resistor 56, and a source electrode that is connected to the connection point d and the other end of the sense resistor 20. The transistor 57 may be another switching element such as a bipolar transistor or the like.

The monitor circuit 55 outputs the sense voltage Vse2 corresponding to the magnitude of the current I4 from a connection point e when the transistor 57 is on. The absolute value of the sense voltage Vse2 is smaller than the absolute value of a sense voltage Vse1 by a drop in the voltage of the monitor resistor 56. The sense voltage Vse1 is a voltage that is generated at both ends of the sense resistor 20. The connection point e is a node at which the monitor resistor 56 and the transistor 57 are connected to each other.

The clamp control circuit 53 has an RS flip-flop 58. The RS flip-flop 58 changes over the output signal S7 from low level to high level at a rising edge of the command signal S1 (see timings t3 and t6 in FIG. 6). By changing over the output signal S7 to high level, the RS flip-flop 58 changes over the transistor 35 and the transistor 57 from off to on. Due to the turning on of the transistor 35 and the transistor 57, the sense diode current Isd can flow through the sense resistor 20, the clamp circuit 37, and the monitor circuit 55.

On the other hand, the RS flip-flop 58 changes over the output signal S7 from high level to low level (see the timings t1 and t4 in FIG. 6) at a timing when the sense voltage Vse2 rises above a threshold (zero in this case) (i.e., at a timing when the output signal S6 changes over from low level to high level). By changing over the output signal S7 to low level, the RS flip-flop 58 changes over the transistor 35 and the transistor 57 from on to off. Due to the turning off of the transistor 35 and the transistor 57, the sense current Ise is allowed to flow to the sense resistor 20, and is prohibited from flowing through the clamp circuit 37 and the monitor circuit 55.

The drive unit 4 is equipped with a control circuit 51. The control circuit 51 is an example of a control unit that controls the driving of the main transistor 12 and the sense transistor 13 based on a detection result of the sense voltage Vse1.

The control circuit 51 has a comparator 59, the comparator 46, the AND circuit 48, the AND circuit 42, and the drive circuit 43.

The comparator 59 is an example of a determination circuit that determines whether the sense current Ise flows to the sense resistor 20 or the sense diode current Isd flows to the sense resistor 20. The comparator 59 can detect that the sense diode current Isd stops flowing or that the sense current Ise starts flowing, and can detect that the sense current Ise stops flowing or that the sense diode current Isd starts flowing.

The comparator 59 inverts the voltage level of the output signal S6 at a timing when it is detected that the sense voltage Vse2 changes across the predetermined threshold Vth. For example, the comparator 59 has a non-inversion input portion that is connected to the connection point e, and an inversion input portion that is connected to the connection point d. In this case, the threshold Vth is set to zero.

When the diode current Id flows, the sense diode current Isd flows as well, so the sense voltage Vse1 is a negative voltage. When it is detected that the sense voltage Vse1 changes from a negative value to a value equal to or larger than zero (i.e., zero or a positive value), the comparator 59 changes over the output signal S6 from low level to high level. The comparator 59 detects that the sense voltage Vse1 changes from a negative value to a value equal to or larger than zero (i.e., zero or a positive value), for example, by monitoring that the sense voltage Vse2 exceeds a reference voltage (zero in this case).

When the output signal S6 changes over from low level to high level, the transistor 35 and the transistor 57 are turned off. When the transistor 35 and the transistor 57 are off, the sense current Ise flows to the sense resistor 20 while no current flows to the clamp circuit 37 and the monitor circuit 55.

On the other hand, when the main current Ie flows, the sense current Ise flows as well, so the sense voltage Vse1 is a positive voltage. In this case, the sense voltage Vse2 is approximately equal to the sense voltage Vse2. When it is detected that the sense voltage Vse1 changes from a positive value to a value equal to or smaller than zero (i.e., zero or a negative value), the comparator 59 changes over the output signal S6 from high level to low level. The comparator 59 detects that the sense voltage Vse1 changes from a positive value to a value equal to or smaller than zero (i.e., zero or a negative value), for example, by monitoring that the sense voltage Vse2 drops below a reference voltage (zero in this case).

Figure 6:
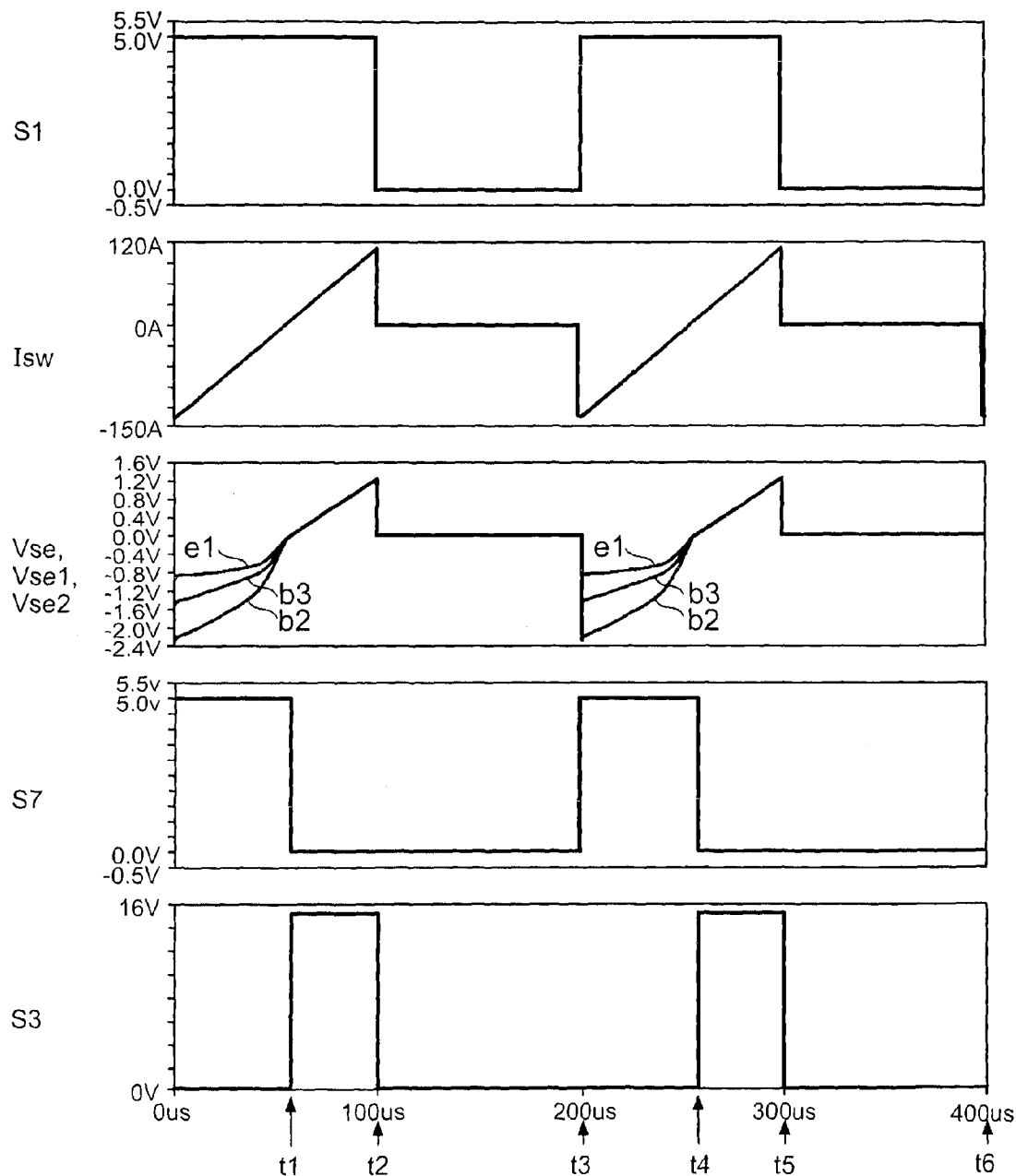
FIG. 6 shows timing charts showing an example of operation waveforms of the semiconductor device.

FIG. 6 shows timing charts showing an example of operation waveforms of the drive unit 4. In FIG. 6, the waveform b2 indicates the sense voltage Vse in the case where it is clamped by the diode 31 of FIG. 1. In contrast, a waveform b3 indicates the sense voltage Vse1 in the case where it is clamped by the transistor 35 of FIG. 5, and a waveform e1 indicates the sense voltage Vse2 in the case where it is clamped by the transistor 35. In either case, the ratio p of the sense diode current Isd to the diode current Id is set larger than the ratio q of the sense current Ise to the main current Ie.

As shown in the drawing, while the detection sensitivity of the current Isw in the vicinity of zero ampere is maintained, the negative peak voltage of the sense voltage Vse1 is held equal to about −1.5 V. Accordingly, the element can be restrained from deteriorating due to a negative overvoltage.

Incidentally, the RS flip-flop 58 of the control circuit 51 may change over the output signal S7 from low level to high level and turn on the transistor 35 and the transistor 57 at a falling edge of the command signal S1 (at the timings t2 and t5 of FIG. 6). That is, the transistor 35 and the transistor 57 may be turned on in synchronization with a timing for detecting a rising edge or a falling edge of the command signal S1.

For example, the control circuit 51 may turn on the transistor 35 and the transistor 57 at any timing within a period from the detection of the timing t2 when the sense current Ise stops flowing to the detection of the timing t3 when the sense diode current Isd starts flowing. The same holds true for the period from the timing t5 to the timing t6.

In this manner, the transistor 35 is turned on at a timing when the main transistor 12 is turned on, so the absolute values of the negative peak voltages of the sense voltages Vse1 and Vse2 can be held small at a timing when the absolute value of the sense diode current Isd is maximized.

Besides, the current I4 flowing to the clamp circuit 37 is monitored by the transistor 57, and the transistor 35 and the transistor 57 are turned off at a timing when the current I4 stops flowing. Thus, the sense current Ise can be caused to flow to the sense resistor 20 instead of being caused to flow to the clamp circuit 37 and the monitor circuit 55. Therefore, the sense resistor 20 can be prevented from operating to erroneously detect an overcurrent of the main transistor 12.

Besides, the detection sensitivity of the diode current Id can be adjusted by adjusting the sense ratio of the transistor 57 to the transistor 35, the resistance value of the on-resistor of the transistor 35 or the transistor 57, the resistance value of the monitor resistor 56 and the like. That is, the degree of freedom in adjusting the detection sensitivity of the diode current Id can be enhanced.

Although the semiconductor device has been described above with reference to the embodiments of the invention, the invention is not limited to the aforementioned embodiments thereof. Various modifications and improvements such as combinations, replacements and the like with one, some or all of other embodiments of the invention are possible within the scope of the invention.

For example, the switching element such as the transistor or the like is not limited to an IGBT, but may be an N channel-type MOSFET or a P channel-type MOSFET.

Besides, it is not absolutely required that only the single sense resistor be provided. A plurality of sense resistors may be provided. The same holds true for the diode or the Zener diode.

What is claimed is:

1. A semiconductor device comprising:
   a transistor;
   a diode that is connected in inverse parallel to the transistor;
   a sense transistor that is configured to generate a sense current corresponding to a current flowing to the transistor;
   a sense diode that is configured to generate a sense diode current corresponding to a current flowing to the diode;
   a resistor that is connected at one end of the resister to an emitter of the sense transistor and an anode of the sense diode, and that is connected at the other end of the resister to an emitter of the transistor and an anode of the diode; and
   a clamp circuit that is configured to clamp a voltage that is generated in the resistor when the sense diode current flows, wherein
   a ratio of the sense diode current to the current flowing to the diode is larger than a ratio of the sense current to the current flowing to the transistor.

2. The semiconductor device according to claim 1, wherein
   the clamp circuit has a PN junction whose forward direction is identical to a forward direction of the sense diode.

3. The semiconductor device according to claim 2, wherein
   the PN junction is arranged in parallel with the resistor.

4. The semiconductor device according to claim 2, wherein
   the clamp circuit is equipped with a switching element that has the PN junction in parallel with the switching element.

5. The semiconductor device according to claim 4, further comprising
   a clamp control circuit that is configured to turn on the switching element when the sense diode current flows.

6. The semiconductor device according to claim 5, wherein
   the clamp control circuit is configured to turn on the switching element when it is detected that the sense diode current starts flowing, or when it is detected that the sense current stops flowing.

7. The semiconductor device according to claim 5, wherein
   the clamp control circuit is configured to turn off the switching element when the sense current flows.

8. The semiconductor device according to claim 7, wherein
   the clamp control circuit is configured to turn off the switching element when it is detected that the sense diode current stops flowing, or when it is detected that the sense current starts flowing.

9. The semiconductor device according to claim 5, wherein
   the clamp control circuit has a monitor circuit that is configured to monitor a current flowing to the switching element, and
   the clamp control circuit is configured to control driving of the switching element based on a result monitored by the monitor circuit.

10. The semiconductor device according to claim 9, wherein
    the monitor circuit has a monitor resistor to which a current corresponding to the current flowing to the switching element flows.

11. The semiconductor device according to claim 10, wherein
    the monitor circuit has a control element that is configured to control the current flowing to the monitor resistor in synchronization with turning on/off of the switching element.

12. The semiconductor device according to claim 2, wherein
    the clamp circuit has a Zener diode in series with the PN junction,
    a forward direction of the Zener diode is reverse to the forward direction of the sense diode.

13. The semiconductor device according to claim 1, further comprising:
    a control unit that controls driving of the transistor based on a detection result of a sense voltage generated by the resistor.

14. The semiconductor device according to claim 13, wherein
    the control unit is configured to turn off the transistor when a current flows to the diode.

15. The semiconductor device according to claim 14, wherein
    the control unit is configured to turn off the transistor even upon receiving a command to turn on the transistor, when a current flows to the diode.

16. The semiconductor device according to claims 13, wherein
    the control unit is configured to turn off the transistor when it is detected at least either that a current flows to the diode or that a current equal to or larger than a predetermined value flows to the transistor.

* * * * *